US009888612B2

(12) United States Patent
Torresin et al.

(10) Patent No.: US 9,888,612 B2
(45) Date of Patent: Feb. 6, 2018

(54) HEAT EXCHANGER FOR POWER-ELECTRONIC COMPONENTS

(71) Applicant: ABB Schweiz AG, Baden (CH)

(72) Inventors: Daniele Torresin, Birmenstorf (CH); Bruno Agostini, Zürich (CH); Francesco Agostini, Zürich (CH); Thomas Gradinger, Aarau Rohr (CH); Mathieu Habert, Rixheim (FR)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/401,630

(22) Filed: Jan. 9, 2017

(65) Prior Publication Data

US 2017/0202108 A1 Jul. 13, 2017

(30) Foreign Application Priority Data

Jan. 7, 2016 (EP) ..................................... 16150431

(51) Int. Cl.
H05K 7/20 (2006.01)
F28F 1/02 (2006.01)

(52) U.S. Cl.
CPC ......... H05K 7/20309 (2013.01); F28F 1/022 (2013.01); H05K 7/20318 (2013.01); H05K 7/20327 (2013.01)

(58) Field of Classification Search
CPC ........... H05K 7/20309; H05K 7/20318; H05K 7/20327; F28F 1/022

(Continued)

(56) References Cited

U.S. PATENT DOCUMENTS

2001/0033477 A1* 10/2001 Inoue .................. H01L 23/4006
361/718
2004/0177949 A1* 9/2004 Shimoya ................. F28F 1/022
165/152

(Continued)

FOREIGN PATENT DOCUMENTS

EP 2031332 A1 3/2009
EP 2246654 A1 11/2010

(Continued)

OTHER PUBLICATIONS

European Patent Office, Extended Search Report issued in corresponding Application No. 16150431.1, dated Jul. 22, 2016, 5 pp.

Primary Examiner — Dion R Ferguson
Assistant Examiner — Mandeep S Buttar
(74) Attorney, Agent, or Firm — Taft Stettinius & Hollister LLP

(57) ABSTRACT

It is proposed a two-phase heat exchanger device for a power-electronic module arrangement having a semiconductor module. The two-phase heat exchanger device includes a base plate configured for being in contact with a first semiconductor module at a first side of the base plate; and at least one tube element for a first cooling medium including a first portion having at least one evaporator channel and a second portion having at least one condenser channel. The base plate has a groove containing the tube element, wherein the groove is dimensioned for enabling thermal contact between the base plate and the first portion of the tube element and dimensioned to form a gap between the base plate and the second portion of the tube element for thermal separation of the base plate and the second portion of the tube element.

20 Claims, 5 Drawing Sheets

(58) Field of Classification Search
USPC .............. 361/700, 701, 702, 704, 689, 688;
165/172, 128, 164, 177
See application file for complete search history.

(56) References Cited

U.S. PATENT DOCUMENTS

| 2011/0080711 A1* | 4/2011 | Yesin ................... H01L 23/427 361/700 |
|---|---|---|
| 2013/0077245 A1 | 3/2013 | Gradinger et al. |

FOREIGN PATENT DOCUMENTS

| EP | 2299489 A2 | 3/2011 |
| EP | 2793261 A1 | 10/2014 |
| EP | 2811251 A1 | 12/2014 |
| EP | 2857783 A1 | 4/2015 |
| WO | 2009142070 A1 | 11/2009 |

* cited by examiner

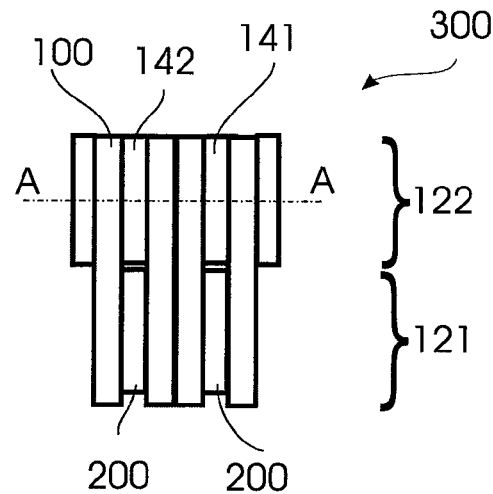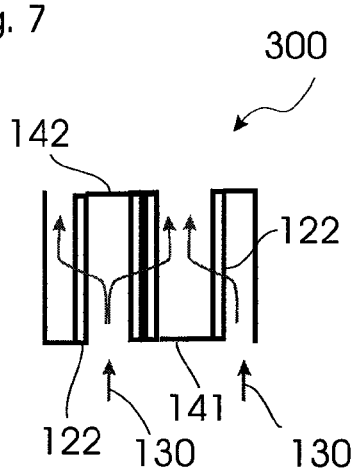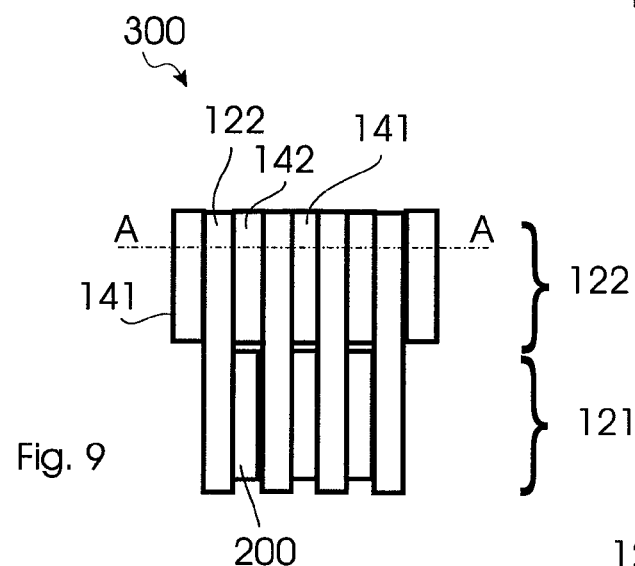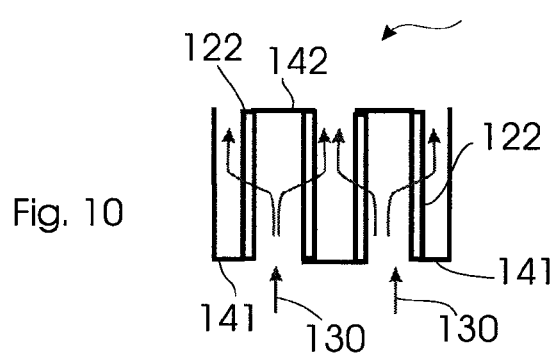

HEAT EXCHANGER FOR POWER-ELECTRONIC COMPONENTS

TECHNICAL FIELD

The invention relates in general to a heat exchanger. In particular, the present invention relates to a heat exchanger that can be used for power-electronics components. The invention further relates to power-electronic module arrangement including a heat exchanger.

BACKGROUND ART

In a typical power-electronic system, power-electronics components such as discrete or integrated (i.e. module type) semiconductor devices, inductors, resistors, capacitors and copper bus-bars are assembled in close proximity. PCB panels and control electronics are also present in all designs. During operation, these components dissipate heat of varying quantities. In addition, these components are subjected to temperatures of varying levels. The thermal management and integration concept of a drive system has to consider the occurring temperature ranges.

For power-electronic (PE) systems in the lower and medium power range, air cooling is an often used solution due to its simplicity, robustness and low investment cost. It is, however, limited in cooling performance compared to water cooling.

Another attractive cooling option is passive two-phase cooling. Here, an evaporator is in thermal contact with a heat source, typically a semiconductor module. The vaporized two-phase fluid is guided to a condenser, where the fluid returns back to liquid state, transferring the heat to ambient air. The motion of two-phase fluid is driven by gravity, pressure pulsations or capillary forces, and does not use mechanical pump. The two-phase fluid is filled at production and the cooler is hermetically closed, such that it is maintenance free over its lifetime.

Like in air cooling, in two-phase cooling the heat is ultimately transferred to air. However, the intermediate step via the two-phase fluid avoids the heat-spreading problem in classical, conduction-based air cooling (air-cooled heat sinks). Therefore, with two-phase cooling, higher cooling performance and heat flux can be achieved than with air cooling.

However, cost considerations and the challenging integration and orientation of a two-phase system into power-electronic systems restrict the application of two-phase cooling systems in power-electronic systems.

BRIEF SUMMARY OF THE INVENTION

In view of the above, a two-phase heat exchanger according to claim 1 and a power-electronic module arrangement according to claim 13 are provided. Further aspects, advantages, and features of the present invention are apparent from the dependent claims, the description, and the accompanying drawings.

According to an aspect of the invention, a two-phase heat exchanger device for a power-electronic module arrangement having at least one semiconductor module is provided. The two-phase heat exchanger device includes a base plate configured for being in contact with a first semiconductor module at a first side of the base plate, and at least one tube element for a first cooling medium, wherein the tube element includes a first portion having at least one evaporator channel and a second portion having at least one condenser channel. Typically, the base plate has a groove containing the tube element. The groove is dimensioned for enabling thermal contact between the base plate and the first portion of the tube element and the groove is dimensioned to form a gap between the base plate and at least a part of the second portion of the tube element for thermal separation of the base plate and the second portion of the tube element.

According to a further aspect of the invention, a power-electronic module arrangement including a stack of semiconductor modules and a plurality of heat exchanger devices according to embodiments described herein is clamped between the semiconductor modules.

The heat exchanger according to embodiments described herein enables the integration of a two-phase heat exchanger into an air cooled power-electronic system (such as a power-electronic converter), in particular in a system, where the semiconductors are arranged in stacks. The incentive is increased cooling performance that can be used in various ways. For instance, the current rating of the power-electronic system can be increased (and, hence, the losses can be increased) at constant junction temperature and/or an increased switching frequency (and, hence, increasing switching losses) and reduced filter sizes can be realized at constant temperature. Alternatively, a lower temperature and, hence, an increased reliability and lifetime at constant current rating can be achieved when using the two-phase heat exchanger device according to embodiments described herein. A further benefit of a two-phase heat exchanger device according to embodiments described herein may be a rating for higher ambient temperature of the power-electronic system for fixed junction temperature. According to some embodiments, a reduced air-flow rate, fan power and acoustic noise can be used for a fixed junction temperature. In addition, weight savings can be realized compared to the relatively bulky aluminum extruded heat sinks.

Thus, with the two-phase heat exchanger device according to embodiments described herein, several effects can be induced allowing an efficient use of the two-phase heat exchanger device in a power-electronic system, in particular a system including a semiconductor stack.

BRIEF DESCRIPTION OF THE DRAWINGS

The subject matter of the invention will be explained in more detail in the following text with reference to preferred exemplary embodiments which are illustrated in the drawings, in which:

FIG. 7 shows a schematic front view of a two-phase heat exchanger device with flow guides according to embodiments described herein;

FIG. 8 shows a schematic sectional view of a two-phase heat exchanger device along line A-A shown in FIG. 7 according to embodiments described herein;

FIG. 9 shows a schematic front view of a two-phase heat exchanger device with flow guides according to embodiments described herein;

FIG. 10 shows a schematic sectional view of a two-phase heat exchanger device along line A-A shown in FIG. 9 according to embodiments described herein;

The reference symbols used in the drawings, and their meanings, are listed in summary form in the list of reference symbols. In principle, identical parts are provided with the same reference symbols in the figures.

PREFERRED EMBODIMENTS OF THE INVENTION

In the following, various aspects and embodiments of the invention are described. It is intended that each of the aspects, whether described in the context of a particular embodiment or of other features or not, can be combined with any other aspect.

In the figures and the following description, the same reference numbers are used for analogous elements, and the description of any embodiment relating to the same reference sign is applicable to any other embodiment unless mentioned otherwise and/or unless the description would be inconsistent with that embodiment.

Figure 1:
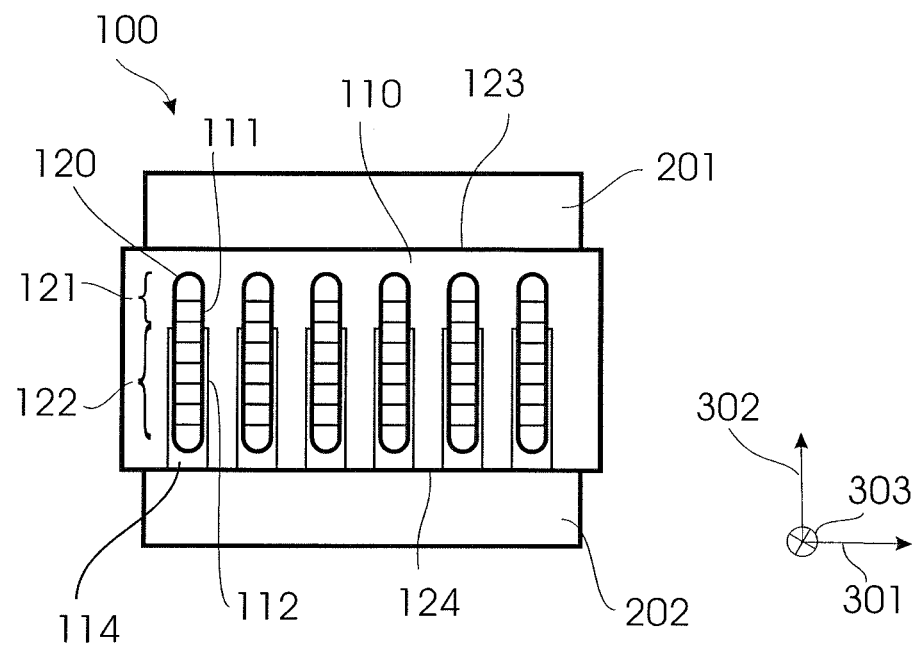
FIG. 1 shows a schematic drawing of a two-phase heat exchanger device with two semiconductor modules according to embodiments described herein.

FIG. 1 shows a two-phase heat exchanger device 100 according to embodiments described herein. The heat exchanger device 100 is exemplarily shown in FIG. 1 as being stacked between two semiconductor modules 201 and 202. Typically, the heat exchanger device 100 and the two semiconductor modules 201, 202 are stacked in a stacking direction 302 as can be seen in the coordinate system in FIG. 1. According to some embodiments described herein, the two semiconductor modules 201, 202 may be part of a power-electronic module arrangement.

According to embodiments described herein, the heat exchanger device 100 includes a base plate 110 configured for being in contact with a first semiconductor module 201 at a first side 123 (in stacking direction) of the base plate 110. Typically, the base plate 110 may be configured for being in contact with a semiconductor module by adapting the geometry of the base plate to the geometry of a semiconductor module. For instance, the base plate 110 and the semiconductor module 201 may have mating surfaces, which may stand in contact which each other. According to some embodiments described herein, the base plate 110 may have a substantially planar surface, in particular at the first side 123, for being in contact with a semiconductor module. Typically, the contact between the base plate 110 and the heat exchanger device allows for conducting heat between the two elements. In some embodiments, the first side 123 of the base plate 110 and a second side 124 being opposite to the first side 123 in stacking direction 302 may be substantially parallel to each other so that in particular a planar outer shape of the base plate is given (interrupted by the grooves 114). The planar outer shape of the base plate, and especially the parallel arrangement of the two sides, allows for a stable stacking of heat exchanger devices and semiconductor modules can be achieved.

The term "substantially" as used herein may mean that there may be a certain deviation from the characteristic denoted with "substantially." For instance, the term "substantially parallel" refers to two elements which may have certain deviations from the exact parallel orientation to each other, such as a deviation from the parallel arrangement of about 1° to about 10°. A further example may be a flow path running substantially in one direction may include a deviation of about 1° to about 10° from the one direction.

As can be seen in FIG. 1, the two-phase heat exchanger device 100 is arranged in a stack of semiconductor modules 201, 202, which are stacked in a stacking direction 302. Typically, the two-phase heat exchanger device 100 is arranged or clamped between semiconductor modules essentially in a plane normal to the stacking direction of the semiconductor stack, such as a plane extending in the width-depth direction (e.g. a plane spanned by directions 301 and 303). The plane, in which the two-phase heat exchanger device is arranged typically includes the first side 123 of the base plate 110 of the two-phase heat exchanger device 100. Typically, the first side 123 of the base plate 110 substantially runs in the width direction 301.

Figure 3:
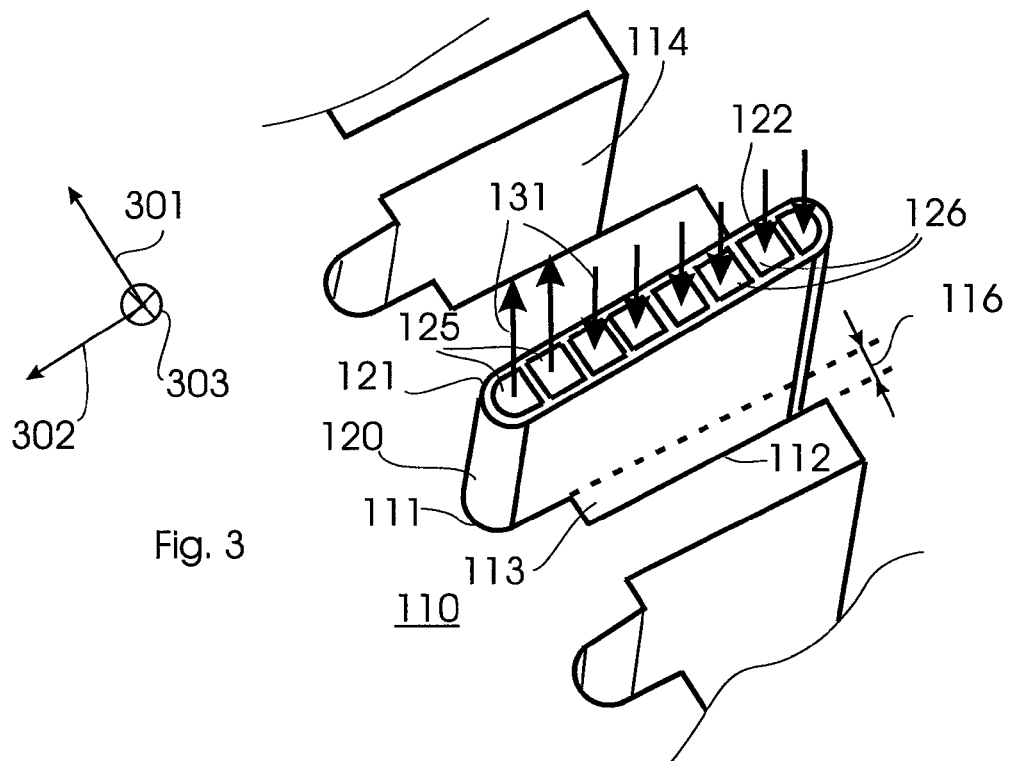
FIG. 3 shows a partial perspective view of a two-phase heat exchanger device according to embodiments described herein.
Figure 4:
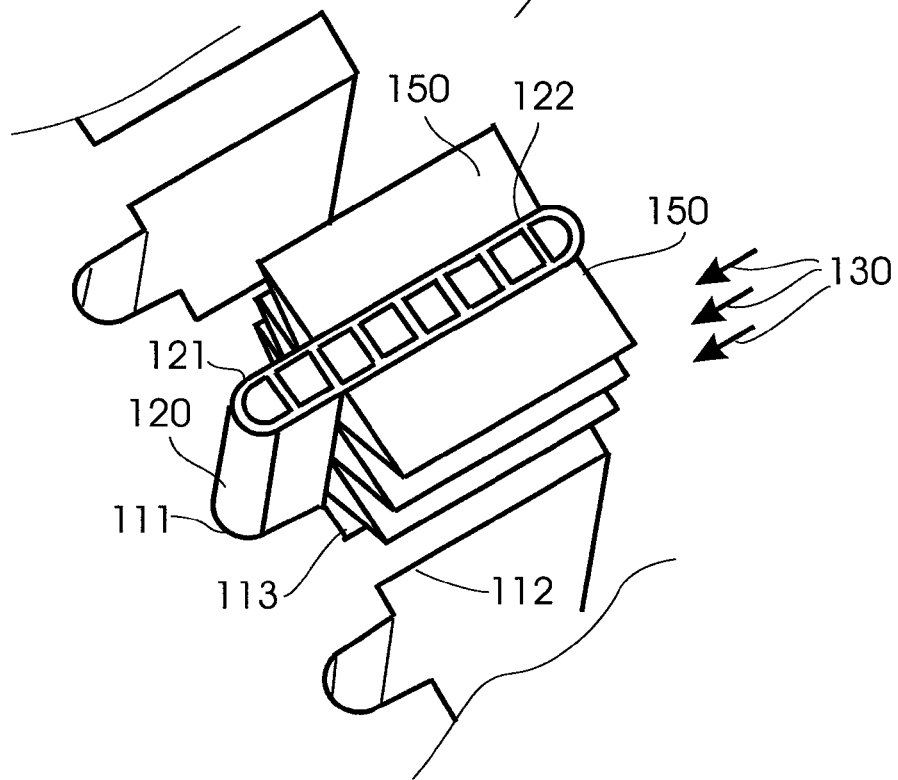
FIG. 4 shows a schematic perspective view of a two-phase heat exchanger device according to embodiments described herein.

According to embodiments described herein, the heat exchanger device 100 further includes at least one tube element 120 for a first cooling medium 131 or working medium (exemplarily shown in FIGS. 3 and 4). The first cooling medium 131 may be a liquid suitable for evaporating at the temperature ranges, which occur in a power-electronic module arrangement (in particular, the first cooling medium evaporates at temperatures less than temperatures occurring in power-electronic module arrangements due to the temperature gradient between the module arrangement to the fluid). Typically, the tube element 120 is a closed element for letting circulate the first cooling medium in it.

The first cooling medium or working medium as described in embodiments herein may be a two-phase fluid having a saturation temperature in a range of typically between about −40° C. and about 100° C., more typically between about 70° C. and about 90° C., and even more typically of about 80° C. According to some embodiments, the temperature range occurring in a power-electronic module arrangement may be between about 40° C. to about 150° C. In some embodiments, the first cooling medium or working medium may have a saturation temperature in the range of the occurring temperature in the power-electronic module arrangement. Typical peak temperatures (junction temperatures) in semiconductor modules may be between about 100° C. to about 175° C. According to some embodiments, the first cooling fluid may at least be one of the group of R134a, R245fa, R1234yf, and R1234ze.

The tube element 120 includes a first portion 121 having at least one evaporator channel 125 and a second portion 122 having at least one condenser channel 126. The evaporator channel 125 and the condenser channel 126 can exemplarily be seen in FIG. 3). In the example shown in FIG. 1, the first portion 121 includes two evaporator channels. The second portion 122 of the example of a tube element 120 of FIG. 1 includes six condenser channels. The skilled person may understand that the number of evaporator channels and condenser channels is not limited to the shown examples and that any suitable number of evaporator channels and condenser channels may be chosen for the tube element according to embodiments described herein. According to embodiments described herein, there is at least one channel dedicated to evaporation and at least one channel dedicated to condensation, when a suitable number of evaporator channels and condenser channels is chosen.

Typically, the evaporator channel(s) and the condenser channel(s) stand in contact with each other so that the first cooling medium can pass through the channels and may evaporate and condense in the channels. The skilled person may understand that the evaporation and condensation takes place in a certain region or portion of the tube element. The exact place of evaporation and condensation may be dependent on the exact temperature, the cooling medium used, the detailed tube geometry, the cooling outside the two-phase heat exchanger device and the like. Thus, although some channels may be denoted as being condenser channels and some channels may be denoted as being evaporator channels for the sake of simplification, some evaporation may take place within the condenser channel and some condensation may take place within the evaporator channel. However, the skilled person may understand that the evaporator channel(s) is named as evaporator channel since the bigger part of evaporation takes place in the evaporator channel. The same applies mutatis mutandis for the condenser channel(s). Also, the evaporator channel(s) may contain liquid cooling medium and gaseous cooling medium during operation. The same applied to the condenser channels(s): the condenser channel(s) may contain liquid cooling medium and gaseous cooling medium during operation.

According to some embodiments, the channels within the tube element 120 are arranged running along a depth direction 303 of the heat exchanger device 100. In some embodiments, the evaporator channel(s) and the condenser channel(s) are aligned substantially in parallel to each other in the tube element 120. The tube element 120 may include separation walls separating the single channels from each other. Typically, for allowing the first cooling medium 131 or working medium to flow between the channels, the channels may be connected together with a manifold (for example, a circular tube or stacked plate with openings).

In some embodiments, the tube element 120 may be a multi-port extruded tube including the evaporator channel(s) and the condenser channel(s). Typically, condenser channel(s) and evaporator channel(s) may be channels of the same MPE tube. Thus, the multi-port extruded tube allows for avoiding separate tubes for evaporator channel(s) and condenser channel(s). Hence no welding is needed, and a cheap production of the heat exchanger device according to embodiments described herein becomes possible.

According to some embodiments, the first portion 121 typically including the evaporator channel(s) is placed nearer to the first side 123 of the base plate 110 than the second portion 122 typically including the condenser channel(s). In other words, the evaporator channel(s) of the first portion 121 are placed nearer to the first semiconductor module 201 (with which the base plate 110 of the heat exchanger device 100 typically stands in contact).

The base plate 110 may typically be made of a (highly) thermally conductive material such as aluminum, brazeable aluminum or copper. The base plate may be manufactured using extrusion, casting, machining or a combination of such common processes. The base plate 110 may typically not be made to the exact size of the tube element 120. In particular, the base plate 110 may be made larger than the tube element in width direction 301 in order to increase thermal capacitance to the system.

Figure 2:
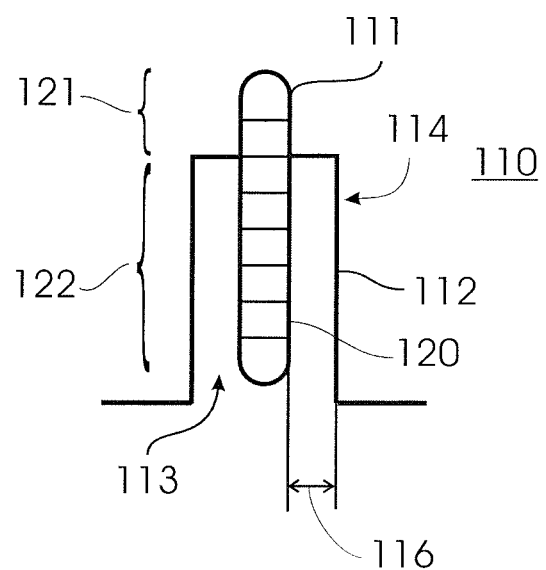
FIG. 2 shows a partial view of a two-phase heat exchanger device according to embodiments described herein.

According to embodiments described herein, the base plate 110 has a groove 114 containing the tube element 120. FIG. 2 shows an enlarged view of the base plate 110, the groove 114 and the tube element 120 in the groove. A first groove portion 111 in the base plate 110 is dimensioned for enabling thermal contact between the base plate 110 and the first portion 121 of the tube element 120. Typically, the tube element 120 and the base plate 110 can exchange heat energy in the region of the first portion 121 of the tube element 120. Heat being transferred from the base plate 110 to the first portion of the tube element may cause the first cooling medium 131 or working medium to evaporate in the evaporator channels.

The thermal contact between the base plate 110 and the first portion 121 of the tube element 120 may be provided by a direct physical contact between the base plate and the tube element. According to some embodiments, the contact between the first portion 121 of the tube element 120 and the base plate 110 may be provided via an additional material between the base plate 110 and the first portion 121 of the tube element 120, in particular a material for increasing the thermal contact between the tube element 120 and the base plate 110. According to some embodiments, the connection between the first portion of the tube elements and the base plate may be established by brazing. The tube elements, and in particular the first portion of the tube elements, may be clad with a brazing agent. During brazing, the brazing agent melts and establishes a thermal connection between the first portion of the tube element and the base plate.

Also, apart from a good thermal conductivity between first portion 121 of the tube element 120 and the base plate 110, the first groove portion 111 may ensure a proper fixing of the tube element in the base plate 110 and may be dimensioned accordingly. The dimensions of the groove 114 of the two-phase heat exchanger according to embodiments described herein may be chosen dependent on several parameters, such as the respective application, the dimensions of the product, the requirement, such as environmental conditions, design and the like. In some embodiments, the groove 114 may typically have an extension in direction 302 between about 10 mm and about 100 mm, more typically between about 10 mm and about 70 mm, and even more typically between about 15 mm and about 50 mm.

The groove further includes a second groove portion 112, which is dimensioned to form a gap 113 between the base plate 110 and a part of the second portion 122 of the tube element 120 for thermal separation of the base plate 110 and the second portion 122 of the tube element. According to some embodiments, the gap may surround a part of the extension of the second portion 122 in the depth direction 303. In particular, the part of the second portion being surrounded by the gap may typically include about 10% to about 60%, more typically between about 20% and about 50% and even more typically between 20% and 40% of the whole extension of the second portion of the tube in depth direction 303. Thermal separation may mean that substantially no heat energy exchange takes place between the thermally separated elements, e.g. the second portion 122 of the tube element 120 and the base plate 110. For instance, the gap 113 may offer a thermal separation between the second portion of the tube elements and the base plate.

According to some embodiments, the first groove portion 111 is narrower than the second groove portion 112, especially for realizing the thermal contact between the first portion 121 of the tube element 120 and the base plate 110 and for avoiding thermal contact between the second portion 122 of the tube element 120 and the base plate 110. Typically, the extension of the first groove portion 111 in width direction 301 may be chosen dependent on several parameters, such as the respective application, the dimensions of the product, the requirement, such as environmental conditions, design and the like. In some embodiments, the extension first groove portion 111 in width direction 301 may typically be between about 1 mm and about 5 mm, more typically between about 1 mm and about 4 mm. according to some embodiments, the extension of the second groove portion 112 in width direction 301 may typically be between 2 mm and about 20 mm, more typically between about 2 mm and about 15 mm.

Typically, the gap size 116 of the gap 113 can be seen in FIG. 2. Typically, the gap size 116 may be measured as the shortest distance between the tube element 120, especially the second portion 122 of the tube element, and the second groove portion 112 of the groove 114 in the base plate 110. In some embodiments, the gap size 116 may be measured substantially perpendicular to the second groove portion 112 and the second portion 122 of the tube element 120. According to some embodiments, the gap size 116 may typically be larger than about 0.5 mm, more typically be equal to or larger than about 1 mm, and even more typically equal to or larger than about 1.5 mm, such as about 2 mm.

According to some embodiments, the extension of the base plate 110 in stacking direction 302 is larger than the extension of the tube element 120 in stacking direction, as can exemplarily be seen in FIGS. 1 and 2. The larger extension of the base plate 110 in stacking direction 302 allows a stable and reliable stacking of the heat exchanger device according to embodiments described herein and the semiconductor modules, which are cooled by the heat exchanger device.

In some embodiments, the two-phase heat exchanger device 100 as described herein may be a passive two-phase heat exchanger. According to some embodiments, the two-phase heat exchanger is one of: gravity-driven thermosyphon; pulsating heat pipe; capillary pumped loop or loop heat pipe.

If a gravity-driven thermosyphon is used, the condenser channel(s) may advantageously be arranged above the evaporator channel(s) in vertical direction, i.e. the gravity-driven thermosyphon is substantially vertically oriented. According to some embodiments described herein, this means that the stacking direction may be substantially horizontal.

Figures 11, 12:
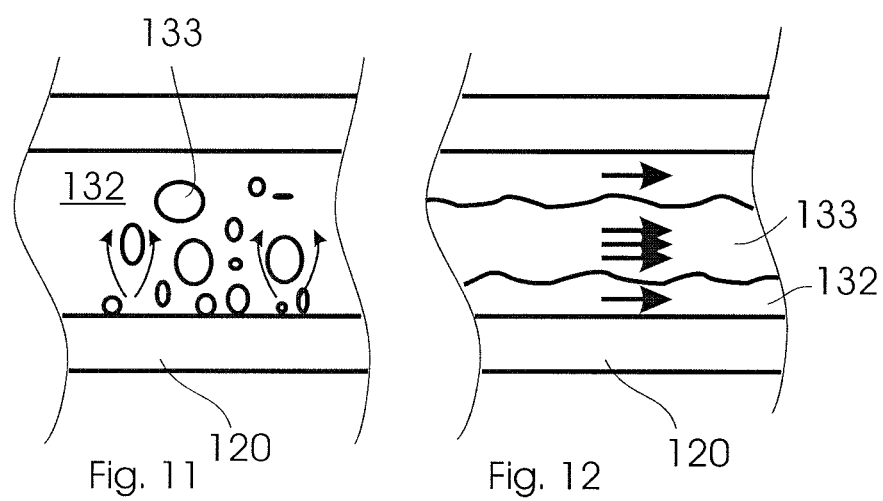
FIG. 11 show a schematic view of a pool boiling situation in a tube element.
FIG. 12 shows a schematic view of a convection boiling situation in a tube element according to embodiments described herein.

According to some embodiments described herein, the tube elements used in a heat exchanger device according to embodiments described herein may be configured and dimensioned to cause convection boiling of the first cooling medium in the tube elements, especially the evaporator portion of the tube element. The skilled person may understand that heat is taken away from the tube wall surface by conduction through a liquid refrigerant film at the tube wall for convection boiling. The liquid refrigerant, such as the first cooling medium, is led through the tube element having a confined width for preventing pool boiling. Pumping or bubble pumping may increase the velocity of the vapor stream within the tube element. With pool boiling, on the other hand, heat is taken away from the wall surface by continuous nucleating vapor bubbles that slowly hover off the wall surface for gravity reasons. The thermal efficiency is higher with convection boiling than pool boiling, because the velocity of the vapor stream and the vapor quality is higher than in pool boiling situations. The reasons are that the vapor is removed comparatively quickly from the spot where vaporization took place and the liquid refrigerant neighboring the vapor stream is not heated up that much with convection boiling. As a result, the thermal energy content of the vapor derived by convective boiling is higher than in a pool boiling situation. The difference between pool boiling and convection boiling is schematically shown in FIG. 11 (pool boiling) and FIG. 12 (convection boiling). FIGS. 11 and 12 show a section of a tube element 120 in the evaporator portion 121. In the FIGS. 11 and 12, the pool boiling shows bubbles of vapor in the liquid cooling medium 132. The convection boiling shown in FIG. 12 shows a film of liquid cooling medium 132 at the wall of the tube element 120 and a stream of vaporized cooling medium 133 in the middle part of the tube element 120. The skilled person may understand that the liquid cooling medium 132 and the vaporized cooling medium 133 are different states of the first cooling medium 131.

In another embodiment, instead of the gravity-driven thermosyphon, a pulsating heat pipe may be used. An example of an implementation includes a pulsating heat pipe (PLHP). The pulsating heat pipe may have the same external shape as the gravity-driven thermosyphon. Since the two-phase flow is driven by pressure pulsations in the pulsating heat pipe (rather than gravity), the pulsating heat pipe is substantially independent from the orientation. The pulsating heat pipe may also be used in a substantially horizontal orientation. This enables a vertical stacking direction.

As explained before, an air cooling system is often chosen in nowadays systems. In order to obtain a competitive advantage, it is not necessarily sufficient that two-phase cooling is more performant than air cooling. It is desired that the two-phase cooling system is also cheaper than known water cooling systems.

According to some embodiments, in order to achieve a significant cost advantage compared to known systems, a cheap two-phase cooling system is chosen, which may be combined with an open air cooling of the electrical room, in which the power-electronic system is installed. Furthermore, as described above, the evaporator channel(s) and the condenser channel(s) may be integrated into a single piece, which avoids manual production steps such as the mounting of the different channels to a tube element.

For instance, if a thermosyphon system is chosen, the two-phase heat exchanger may be gravity-driven and it is oriented such that the condenser is at the top, and the evaporator at the bottom. Furthermore, the form factor of a thermosyphon system is different from air-cooled heat sinks. Also, some designs of a thermosyphon system may be rather flat, i.e. much less deep in air-flow direction. Typically, the air pressure drop is much lower than that of an air-cooled heat sink resulting in less fan power used for the same cooling effect or, with constant fan power, resulting in a better cooling effect.

The skilled person may thus understand that there are several challenges associated with the integration of the two-phase heat exchanger into a power-electronic system. As mentioned above, the form factor is totally different from that of an air-cooled heat sink, and the pressure drop is lower; the orientation sensitivity must be respected (e.g. condenser at the top in the case of a gravity driven two-phase heat exchanger); the two-phase heat exchanger is advantageously clamped in a stack of semiconductor modules, and the arrangement is desired to be compact; to avoid thermal stacking, the air flow through the two-phase heat exchanger device is desired to be substantially in parallel (i.e. parallel connected); and the air flow through the semiconductor modules is desired to be in a direction from front to back in the cabinet of the power-electronic system.

The two-phase heat exchanger device according to embodiments described herein solves the above described problems and offers the desired advantages discussed above.

FIGS. 3 and 4 show further partial views of a two-phase heat exchanger device according to embodiments described herein. FIG. 3 shows a partial view of a two-phase heat exchanger adapted for being clamped in a stack of semiconductor modules. The base plate 110 has grooves 114 that receive the tube element 120. In FIG. 3, only one tube element 120 is shown, although several tube elements may be provided, as can exemplarily be seen in FIG. 1. The groove has a first groove portion 111 for a first portion 121 of the tube element 120, which may be a multi-port extruded (MPE) tube through which the first cooling medium 131 flows (as exemplarily indicated by arrows 131 in FIG. 3).

According to some embodiments, the wall thicknesses of a multi-port extruded flat tube may be between about 0.2 to about 0.75 mm. The material of the tube may be aluminum or the like. According to some embodiments, which may be combined with other embodiments described herein, the tubes as referred to herein may be configured for withstanding a pressure of about 100 bars. In particular, the wall thickness may be chosen accordingly. The first cooling medium may have a pressure between about 0.1 bar and about 30 bar in typical applications of the two-phase heat exchanger device for semiconductor modules according to embodiments described herein.

In the example shown, the first topmost channel in the tube element 120 is an evaporator channel 125 that is thermally in contact with the base plate 110. For the sake of a better overview, only one large evaporator channel is shown, although the skilled person may understand that there may be more than one evaporator channel, especially more than one smaller evaporator channel than the one shown in FIGS. 3 and 4. The remaining channels of the second portion 122 of the tube element 120 may be condenser channels 126 and are not in thermal contact with the base plate 110 according to embodiments described herein. Arrows 131 denote the first cooling medium flowing through the evaporator channel 125 and the condenser channel 126. At the second portion 122 of the tube element 120 including the condenser channels 126, the grooves 114 are wider than at the first portion 121 of the tube element including the evaporator channel 125 such that direct contact and heat transfer of the base plate 110 with the condenser channels 126 is avoided. In particular, for adapting the two-phase heat exchanger device to a stack of semiconductor modules, the base plate 110 is thicker in stacking direction compared to known systems. Also, the grooves 114 in the base plate 110 are designed deeper as compared to known systems. According to some embodiments, the grooves especially provide a greater extension in stacking direction than the tube element 120, which can exemplarily be seen in FIG. 1. With the design of deeper grooves according to embodiments described herein, semiconductor modules can be clamped from both sides. According to some embodiments, the dimensions of the base plate may be chosen dependent on several parameters, such as the respective application, the dimensions of the product, the requirement, such as environmental conditions, design and the like.

FIG. 4 shows a partial view of a further embodiment of a two-phase heat exchanger device. The two-phase heat exchanger device of FIG. 4 may be a two-phase heat exchanger device as described before, e.g. with respect to FIGS. 1 to 3. The embodiment exemplarily shown in FIG. 4 includes fins 150 provided at the second portion 122 of the tube element 120 on the outer side of the tube element 120. The outer side of the tube element 120 may be understood as the side, where the first cooling medium does not flow.

The fins 150 are typically provided above the gap 113 in the depth direction 303 or at a part of the condenser portion of the tube element not surrounded by the gap 113. According to some embodiments described herein, the fins 150 increase the heat exchange and support the condensation of the first cooling medium 131 or working medium in the condenser channels 126 of the tube element. In the example shown in FIG. 10, only three fins 150 are shown at each side of the tube element for the sake of a better overview. However, the skilled person may understand that the number of the fins may vary and may be adapted to the respective application. For instance, the number of fins on each side may be larger than 3, such as larger than 5, or even larger than 10.

The fins 150 may be cooled by a convective flow of an external second cooling medium 130, such as air. The flow of the second cooling medium 130 may e.g. generated by a cooling fan or blower (not shown). Furthermore, the fins may be provided in the shape of louvered fins. Louvered fins may be used to increase the heat-transfer coefficient without significant increase in pressure drop (louvers are twisted slits on the fin's surface). Generally, the fins may be cut from a strip of sheet aluminum and bent into an accordion-like shape as shown in FIG. 4. The pitch between the fins can be easily adjusted to the size of the two-phase heat exchanger and the respective intended application of the heat exchanger.

The skilled person may understand that the fins, although described and shown in an accordion-like shape, may have any suitable shape for increasing the heat transfer from the second portion 122 of the tube element 120 to the second cooling medium 130, such as wavy fins, straight fins, louvered fins and the like.

According to some embodiments, smaller channels with dividing walls or additional fin-like features on the inner-wall surfaces may be used for the condenser channels 126 of the tube element 120, especially to increase the inner channel surface, thereby increasing the heat-transfer surface.

Figure 5:
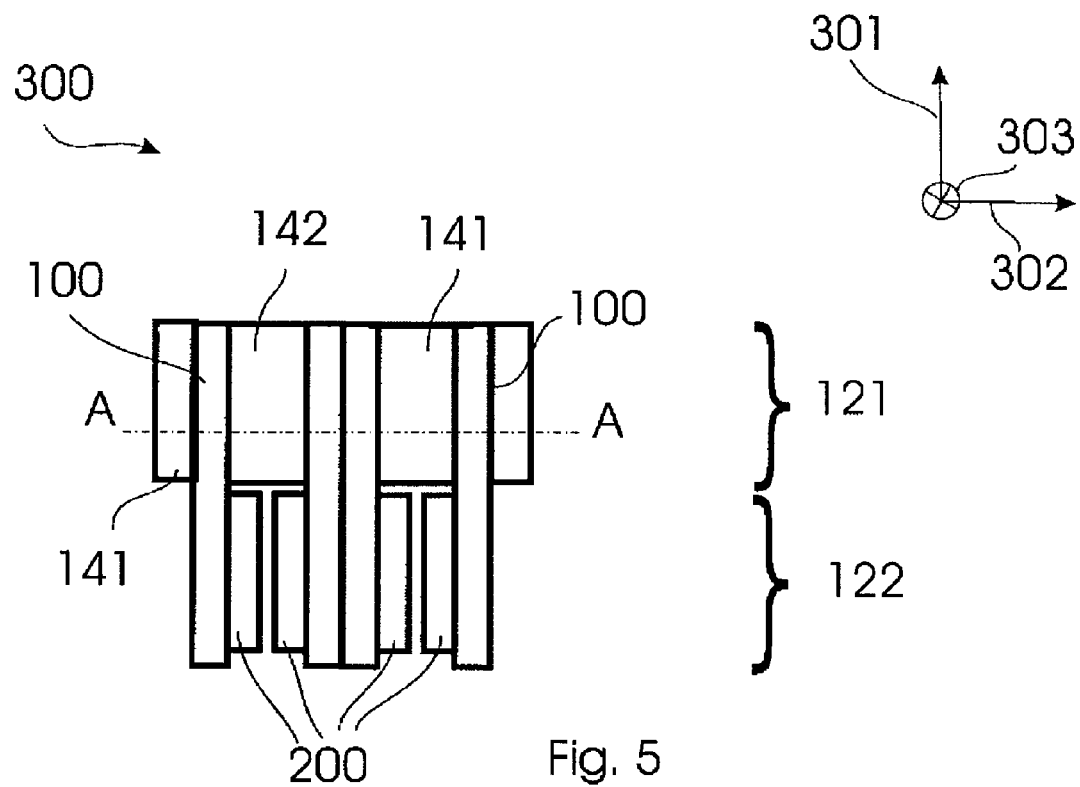
FIG. 5 shows a schematic front view of a two-phase heat exchanger device with flow guides according to embodiments described herein.
Figure 6:
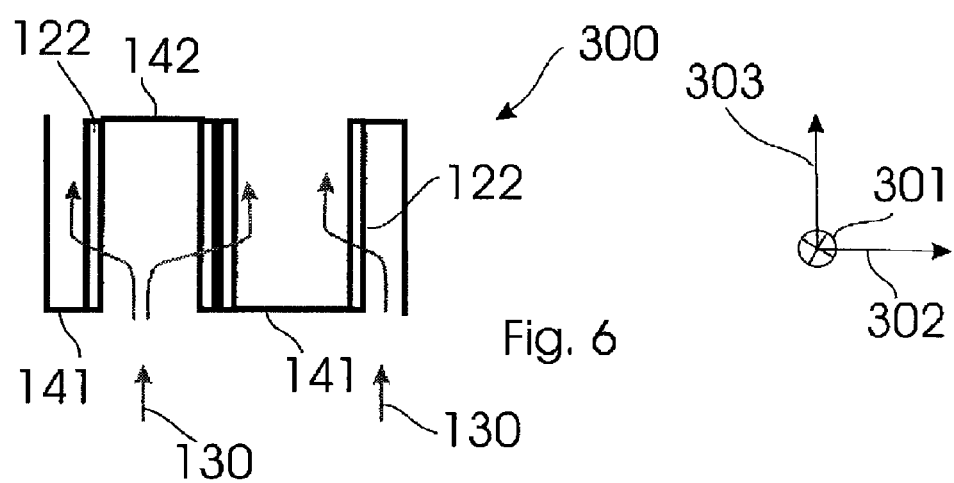
FIG. 6 shows a schematic sectional view of a two-phase heat exchanger device along line A-A shown in FIG. 5 according to embodiments described herein.

FIGS. 5 and 6 show an arrangement 300 of two-phase heat exchanger devices in a stack of semiconductor modules according to embodiments described herein. FIG. 5 is a front view of the arrangement and FIG. 6 is a sectional view along line A-A as for instance shown in FIG. 5. As shown in FIGS. 5 and 6, the two-phase heat exchanger devices 100 are clamped between semiconductor modules 200 forming a stack of semiconductor modules. A second cooling medium 130, such as air, enters the arrangement 300 (or a cabinet of the power-electronic system) in a depth direction 303, which is the direction into the plane of projection in FIG. 5. The second cooling medium 130 typically flows from front to back of the arrangement 300, as can be seen in FIG. 6 in a more detailed manner. The flow of the second cooling medium 130 cools the semiconductor modules 200, and is finally sucked upwards (in the width direction 301), and in particular expelled by fans mounted on the cabinet roof of the power-electronic system.

According to some embodiments, which may be combined with other embodiments described herein, the air flow of the second cooling medium 130 may be guided by flow guides 141, 142 as exemplarily shown in FIGS. 5 and 6. In some embodiments, the flow guides 141, 142 force the second cooling medium 130 arriving to the heat exchanger device 100 from outside of the heat exchanger device 100 to pass the second portion of the tube element 120 and then away from the heat exchanger device 100. As can be seen in the examples of FIGS. 5 and 6, the flow guides may be arranged in an alternating manner before and after the two-phase heat exchangers 100 in depth direction 303.

The flow path of the second cooling medium 130 according to embodiments described herein is beneficial in terms of compactness and cooling performance. The described flow path may therefore be used in many power-electronic systems that are integrated in cabinets. In particular, the different two-phase heat exchanger devices, which may be cooled in by the second cooling medium are advantageously arranged in parallel in the flow path of the second cooling medium, which avoids thermal stacking of the stack of semiconductor modules according to some embodiments described herein.

In FIGS. 5 and 6, the two-phase heat exchanger devices 100 are sandwiched between the semiconductor modules 200. For instance, FIG. 5 shows a sequence of two-phase heat exchanger device (or cooler C) and semiconductor module (S) of CSSCCSSC. The exemplarily shown sequence means that each semiconductor module 200 is cooled only from one side. In the arrangement 300, typically, a bus bar (not drawn in the figure) is clamped between the adjacent semiconductors.

FIGS. 7 and 8 show alternative arrangements of a two-phase heat exchanger device 100 in a stack of semiconductor modules 200 according to embodiments described herein. The two-phase heat exchanger device 100 each includes a two-phase heat exchanger and flow guides according to some embodiments described herein. FIG. 7 is a front view of the arrangement 300 and FIG. 8 is a sectional view along line A-A as for instance shown in FIG. 7. FIGS. 7 and 8 show an embodiment, in which the sequence of two-phase heat exchanger device 100 (or cooler C) and semiconductor module (S) is CSCCSC. The arrangement 300 of FIGS. 7 and 8 allows for two-sided cooling of each semiconductor module 200.

FIGS. 9 and 10 show an embodiment of an arrangement 300 of two-phase heat exchanger device 100 and semiconductor modules 200 according to embodiments described herein. The sequence of cooling units and semiconductor modules is in the embodiment of FIGS. 9 and 10 CSCSCSC. Generally, one-side or two-side cooling of a semiconductor module may depend on the orientation of the cooling units with respect to the semiconductor modules. For instance, the cooling units according to embodiments described herein may provide a more efficient side (such as first side 123 of the base plate in FIG. 1) and a less efficient side (second side 124 of the base plate opposite to the first side 123). The more efficient side is the side considered to provide the best cooling effect. A semiconductor module arrangement as shown in FIGS. 9 and 10 may thus be in contact with one more effective side of a first cooling unit and one less effective side of a second cooling unit or with the more effective sides of both cooling units, depending on the orientation of the cooling unit. In the example shown in FIGS. 9 and 10, the semiconductor module at the right side is two-sided cooled, and the rest of the semiconductor modules are one-sided cooled. The one-side cooling and/or the two-side cooling may be chosen as desired to achieve a desired cooling performance according to embodiments described herein.

According to some embodiments described herein, which may be combined with other embodiments described herein, the two-phase heat exchanger devices are planar and are, when clamped into the stack of semiconductor modules, normal to the stacking directing 302. Generally, the stacking direction may either be horizontal (left-right), or vertical (although the figures only show a horizontal stacking direction). Typically, the extended base plate 110 allows for stacking the two-phase heat exchangers and the stack of semiconductor modules properly.

The arrangement of the two-phase heat exchanger device and the stack of semiconductor modules according to embodiments described herein may result in the second cooling medium flowing substantially in an S-shaped path through the arrangement, as shown by arrows 130 in FIGS. 6, 8 and 10. For forcing the flow of the second cooling medium 130 as shown, the space between the two-phase heat exchangers are blocked by flow guides 150 as described above, in particular alternately in front of the condenser channel(s) of the two-phase heat exchanger, and in the back of condenser channel(s) of the two-phase heat exchanger in depth direction 303. The flow guide being arranged in front of the two-phase heat exchanger device in depth direction 303 is denoted with reference sign 141, and the flow guide being arranged in back of the two-phase heat exchanger in depth direction 303 is denoted with reference sign 142. Further flow guides may be provided, e.g. including vertical and horizontal plates that run from front to back in depth direction, such that respective channels for a desired flow path can be formed. According to some embodiments, the flow guides 141, 142 may be located at different positions in the stacking direction 302 at the two-phase heat exchanger device.

According to some embodiments, a power-electronic module arrangement including a stack of semiconductor modules and a plurality of heat exchanger devices according to any of the above described embodiments clamped between the semiconductor modules is provided. In some embodiments, the power-electronic module arrangement further includes a cabinet for the power-electronic module arrangement for allowing an external second cooling medium 130 to enter the cabinet from the front direction corresponding substantially to a width direction 301 of the heat exchanger device 100 for cooling the second portion 122 of the tube element 120, in particular by passing fins provided at the second portion 122 of the tube element 120. The second cooling medium entering the cabinet from the width direction may include that the second cooling medium flows in depth direction 303 crossing the plane formed by depth direction 303 and width direction 301 (thus flowing substantially parallel to direction 302), as can exemplarily be seen in FIGS. 5 to 10.

The cabinet (not shown) of the power-electronic module arrangement may include front doors, through which the second cooling medium 130 may be guided to reach the two-phase heat exchanger. Also, fans or the like may be provided for guiding the second cooling medium into and out of the cabinet.

According to some embodiments, a power-electronic converter arranged in a cabinet is provided. Typically, the power-electronic converter comprises at least one semiconductor stack with at least one semiconductor module and at least two two-phase coolers. Typically, the two-phase coolers may be two two-phase heat exchanger devices as described in embodiments above. The two-phase cooler may be of an essentially planar shape, especially a planar outer shape, and includes an evaporator portion and a condenser portion. According to alternative or additional embodiments, each two-phase cooler includes at least one tube having multiple channels, wherein at least one channel is used to evaporate a two-phase medium, and at least one channel is used to condensate the two-phase medium back to liquid. In the power-electronic converter according to embodiments described herein, the evaporators of the two-phase coolers may be clamped to the at least one semiconductor module in stacking direction in the stack of semiconductor modules.

Typically, the condenser portion of the two-phase cooler may additionally be air cooled. The cooling air may enter the cabinet, in which the power-electronic converter is located, from the front direction (which may be, according to some embodiments, the width direction of the two-phase cooler). According to some embodiments, the power-electronic converter includes air guides in the cabinet, arranged such that the cooling air is flowing through the at least two condenser portions of the two-phase cooler in parallel, thereby avoiding thermal stacking. Thermal stacking generally appears when several semiconductor modules are cooled by a cooling fluid, which passes the semiconductor modules consecutively so that the cooling fluid is continuously heated up.

According to some embodiments, which may be combined with other embodiments described herein, the two-phase coolers are passive. Typically, a two-phase cooler as referred to herein may be one of: a gravity-driven thermosyphon; a pulsating heat pipe; a capillary pumped loop or a loop heat pipe. In the power-electronic converter according to embodiments described herein, the stacking direction of the stack of semiconductor modules is substantially normal to the front-back direction of the cabinet, in which the power-electronic converter is arranged. The front-back direction of the cabinet may thus run substantially along the depth direction of the two-phase coolers. According to some embodiments, the two-phase coolers are arranged substantially in a plane normal to the stacking direction. This may mean that the two-phase coolers are arranged facing each other. In particular, two planes extending in the depth-width direction of adjacent two-phase coolers may face each other.

In some embodiments, the air guiding is substantially effected by blocking parts of the flow cross-section in front of the condenser portions and behind the condenser portions (in particular in depth direction of the two-phase coolers). Blocking parts of the flow cross-section of the air flow in the described manner may force the air to pass through the condenser portions in stacking direction (i.e. in width direction of the two-phase coolers). According to some embodiments, blocking parts of the flow cross-section of the air flow in the described manner causes the air flow to firstly flow in front-back direction of the cabinet towards the stack of semiconductor modules (such as depth direction 303 in FIGS. 5 and 6), then to flow in stacking direction through the condenser portions (such as in stacking or length direction 302 crossing the plane formed by the directions 303 and 301 as can be seen in FIG. 6), and then to flow further towards the back (e.g. again substantially in depth direction 303). The flow path of the second cooling medium (e.g. the air), may hence substantially follow an S-shaped path, as shown in FIGS. 6, 8 and 10. According to some embodiments, the pressure drop through the second portion of the two-phase heat exchanger is rather low, in particular lower than that of air-cooled heat sinks as known. The reduced pressure may be used to compensate the additional pressure drop that arises through the S-shape of the air-flow path according to embodiments described herein. In some embodiments, the condenser portions are of fin-and-tube type, e.g. for increasing the cooling effect of the second cooling medium.

The skilled person may understand that the above described embodiments herein provide several benefits. For instance, a standard, planar base-to-air two-phase heat exchanger may be used for forming the two-phase heat exchanger device according to embodiments described herein, which reduces costs. Further, like in air cooling systems with heat sinks, the cooling units are on potential, and air may be used as electrical insulation. An electrical insulation in the cooling unit is saved, making the cooling unit according to embodiments described herein still further cheap.

As discussed in detail above, in particular with respect to FIGS. 5 to 10, the heat two-phase exchanger device according to embodiments described herein offers flexibility. The arrangement of the two-phase exchanger device as such can flexibly be designed, as well as a power-electronic module arrangement having a plurality of semiconductor modules and heat exchanger devices. Additionally, the two-phase heat exchanger may be designed less thick than an air-cooled heat sink as used in known systems. Thus, the length of the stack in stacking direction can be reduced (in particular, length in the case of a horizontal stacking, height in the case of vertical stacking). The reduction can be used to compensate for the additional height used for the condenser portion of the cooling unit.

According to some embodiments, the cooling power can be adapted playing with the height (or width in direction 301) of the condenser portion, leaving the length (in direction 302) of the stack of semiconductor modules unaffected.

According to some embodiments, the two-phase heat exchanger device according to embodiments described herein may be used in a first example of a cooling unit. According to the first example, the cooling unit may be configured for a power electronic module arrangement and may include the two-phase heat exchanger including a plurality of tube elements (120) extending in a width direction (301) of the cooling unit, within and communicating between an evaporator portion (121) and a condenser portion (122) of the cooling unit. The tube elements (120) may be arranged in a spaced-apart manner along a depth direction (303) of the cooling unit forming cooling paths (213) for allowing a second or external cooling medium (130) to flow through the cooling paths (213) for cooling a working medium within the at least one tube element (120), the cooling paths (213) traversing the condenser portion (122) in a length direction (302) of the cooling unit. The cooling unit may further include flow guides (141; 142) for forcing a second or external cooling medium (130) arriving at the heat exchanger from outside of the cooling unit through the cooling paths (213) and then away from the cooling unit. According to a second example, which may be combined with the first example, the two-phase heat exchanger may be passive with respect to the working medium, and/or is one of: gravity-driven thermosyphon; pulsating heat pipe; capillary pumped loop or loop heat pipe. According to a third example, which may be combined with at least one of the first and second example, the at least one tube element (120) may include at least one evaporator channel (125) in the evaporator portion (121) of the cooling unit for evaporating a first cooling medium (131) and at least one condenser channel (126) in the condenser portion (122) of the cooling unit for condensing the first cooling medium (131). According to a fourth example, which may be combined with at least one of the first to third example, the two phase heat exchanger may include a base plate (110) in the evaporator portion (121), wherein the at least one tube element (120) of the two-phase heat exchanger may at least partially be arranged in a groove (114) in the base plate (110). According to a fifth example, which may be combined with at least one of the first to fourth example, the condenser portion (122) of the cooling unit may be of the fin-and-tube type having fins (150) extending in the cooling path. According to a sixth example, which may be combined with at least one of the first to fifth example, the at least one tube element (120) may be a multi-port extruded tube. According to a seventh example, which may be combined with at least one of the first to sixth example, the flow guides (141; 142) are configured for receiving the second or external cooling medium (130) arriving at the heat exchanger from a direction essentially perpendicular to the length direction (302), preferably along the depth direction (303), and/or for releasing the cooling medium to a direction essentially perpendicular to the length direction (302), preferably along the depth direction (303) and/or the width direction at an opposite side of the incoming cooling medium. According to an eighth example, which may be combined with at least one of the first to seventh example, the cooling unit may further include a plurality of two-phase heat exchangers stacked in a stacking direction (302) corresponding to the length direction (302) of the cooling unit, wherein the flow paths between the condenser portions (122) of the respective two-phase heat exchangers may be blocked by flow guides (141; 142) alternately at the first side (161) of the cooling unit and the second side (162) of the cooling unit opposite to the first side in the depth direction (303). According to a ninth example, a power-electronic module arrangement is provided including the cooling unit according to any of the above described examples. According to a tenth example, which may be combined with the ninth example, the power-electronic module arrangement may further include a plurality of semiconductor modules (200) being stacked in a stacking direction (302) corresponding to a length direction (302) of the cooling unit and including a plurality of two-phase heat exchangers, wherein each semiconductor module (200) is in contact with at least one two-phase heat exchanger. According to an eleventh example, which may be combined with the tenth example, the flow guides (141; 142) of the cooling units of the plurality of cooling units may block the flow of the cooling medium (130) at one side of a two-phase heat exchanger in stacking or length direction (302). According to a twelfth example, which may be combined with at least one of the ninth to eleventh example, flow guides (141; 142) of the cooling units of the plurality of cooling units may block the flow of cooling medium between neighboring cooling units alternately at a first side (161) of the cooling unit in depth direction (303) and a second side (162) of the cooling unit opposite to the first side in the depth direction (303). According to an 13$^{th}$ example, which may be combined with at least one of the tenth to twelfth example, the two-phase heat exchanger may be in contact with the semiconductor modules (200) by being clamped to one of the semiconductor modules essentially in a plane normal to the stacking direction (302). According to an 14$^{th}$ example, which may be combined with at least one of the ninth to 13$^{th}$ example, the power-electronic module arrangement may further comprise a cabinet for the power-electronic module arrangement, wherein a cooling medium (130) enters the cabinet from the front direction corresponding substantially to the width direction (301) of the cooling unit for cooling the condenser portion (122) of the cooling unit.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

REFERENCE NUMERALS 100 two-phase heat exchanger
110 base plate
111 first portion of the groove
112 second portion of the groove
113 gap
114 groove
116 gap size
120 tube element
121 first portion of the tube element
122 second portion of the tube element
123 first side of cooling unit in stacking direction
124 second side of cooling unit in stacking direction
125 evaporator channel of the tube element
126 condenser channel of the tube element
130 external (second) cooling medium
131 working fluid, first cooling medium
141, 142 flow guides
150 fins
200, 201, 202 semiconductor modules
300 arrangement
301 width direction
302 length direction, stacking direction
303 depth direction

The invention claimed is:

1. Two-phase heat exchanger device for a power-electronic module arrangement having at least one semiconductor module, the two-phase heat exchanger device comprising: a base plate configured for being in thermal contact with a first semiconductor module at a first side of the base plate; and at least one tube element for a first cooling medium, the tube element comprising a first portion having at least one evaporator channel and a second portion having at least one condenser channel; wherein the base plate has a groove containing the tube element; wherein the groove is dimensioned for enabling thermal contact between the base plate and the first portion of the tube element, and wherein the groove is dimensioned to form a gap between the base plate and at least a part of the second portion of the tube element for thermal separation of the base plate and the second portion of the tube element.

2. The heat exchanger device according to claim 1, wherein the thermal contact between the first portion of the tube element and the base plate is enabled by a physical contact between the base plate and the first portion of the tube element in the groove, wherein in particular the physical contact is provided by direct contact between the base plate and the first portion of the tube element or via an additional material between the base plate and the first portion of the tube element.

3. The heat exchanger device according to claim 1, wherein the groove has a first groove portion for receiving the first portion of the tube element and a second groove portion for receiving the second portion of the tube element, wherein the first portion of the groove is narrower than the second portion of the groove.

4. The heat exchanger device according to claim 1, wherein the groove is formed as an extruded slot in the base plate.

5. The heat exchanger device according to claim 1, wherein the two-phase heat exchanger device is configured for being clamped between the first semiconductor module at a first side of the base plate and a second semiconductor module at a second side of the base plate.

6. The heat exchanger device according to claim 1, wherein the two-phase heat exchanger device is a passive two-phase heat exchanger and/or is one of: a gravity-driven thermosyphon; a pulsating heat pipe; a capillary pumped loop or a loop heat pipe.

7. The heat exchanger device according to claim 1, wherein the two-phase heat exchanger device is adapted for being arranged in a stack of semiconductor modules stacked in a stacking direction, wherein the two-phase heat exchanger is arranged essentially in a plane normal to the stacking direction of the semiconductor stack, the plane comprising a first side of the base plate.

8. The heat exchanger device according to claim 1, wherein fins are attached to the second portion of the tube element on the outer side of the tube element.

9. The heat exchanger device according to claim 1, wherein the at least one tube element is a multi-port extruded tube comprising the at least one evaporator channel and the at least one condenser channel.

10. The heat exchanger device according to claim 1, wherein the first side of the base plate is substantially parallel to a second side opposite to the first side.

11. The heat exchanger device according to claim 1, wherein the at least one evaporator channel and at least one condenser channel are aligned in parallel to each other in the tube element.

12. The heat exchanger device according to claim 11, wherein the base plate has an extension in stacking direction greater than the extension of the tube element in stacking direction.

13. The heat exchanger device according to claim 12, wherein the at least one evaporator channel and at least one condenser channel are aligned in parallel to each other in the tube element.

14. The heat exchanger device according to claim 1, wherein the thermal contact between the first portion of the tube element and the base plate is enabled by a physical contact between the base plate and the first portion of the tube element in the groove, wherein in particular the physical contact is provided by direct contact between the base plate and the first portion of the tube element or via an additional material between the base plate and the first portion of the tube element;
wherein the groove has a first groove portion for receiving the first portion of the tube element and a second groove portion for receiving the second portion of the tube element, wherein the first portion of the groove is narrower than the second portion of the groove;
wherein the groove is formed as an extruded slot in the base plate; and wherein the two-phase heat exchanger device is configured for being clamped between the first semiconductor module at a first side of the base plate and a second semiconductor module at a second side of the base plate.

15. The heat exchanger device according to claim 1, wherein the two-phase heat exchanger device is adapted for being arranged in a stack of semiconductor modules stacked in a stacking direction, wherein the two-phase heat exchanger is arranged essentially in a plane normal to the stacking direction of the semiconductor stack, the plane comprising a first side of the base plate;
wherein a plurality of fins are attached to the second portion of the tube element on the outer side of the tube element;
wherein the at least one tube element is a multi-port extruded tube comprising the at least one evaporator channel and the at least one condenser channel; and
wherein the first side of the base plate is substantially parallel to a second side opposite to the first side.

16. A power-electronic module arrangement comprising: a stack of semiconductor modules and a plurality of heat exchanger devices clamped between the semiconductor modules; and wherein each of said plurality of heat exchanger devices comprise: a base plate in thermal contact with a semiconductor module at a first side of the base plate; and at least one tube element for a first cooling medium, the tube element comprising a first portion having at least one evaporator channel and a second portion having at least one condenser channel: wherein the base plate has a groove containing the tube element; wherein the groove is dimensioned for enabling thermal contact between the base plate and the first portion of the tube element, and wherein the groove is dimensioned to form a gap between the base plate and at least a part of the second portion of the tube element for thermal separation of the base plate and the second portion of the tube element.

17. The power-electronic module arrangement according to claim 16, further comprising flow guides for forcing an external second cooling medium arriving to the heat exchanger device from outside of the heat exchanger device to pass the second portion of the tube element and then away from the heat exchanger device.

18. The power-electronic module arrangement according to claim 16, further comprising a cabinet for the power-electronic module arrangement for allowing an external second cooling medium to enter the cabinet from a front direction corresponding substantially to a width direction of the heat exchanger device for cooling the second portion of the tube element of the heat exchanger device.

19. The power-electronic module arrangement according to claim 16, wherein the base plate in thermal contact with another semiconductor module at a second side of the base plate.

20. The power-electronic module arrangement according to claim 17, further comprising a cabinet for the power-electronic module arrangement for allowing an external second cooling medium to enter the cabinet from a front direction corresponding substantially to a width direction of the heat exchanger device for cooling the second portion of the tube element of the heat exchanger device.

* * * * *